United States Patent [19]
Patel

[11] Patent Number: 5,977,588
[45] Date of Patent: Nov. 2, 1999

[54] RADIO FREQUENCY POWER MOSFET DEVICE HAVING IMPROVED PERFORMANCE CHARACTERISTICS

[75] Inventor: Viren C. Patel, Belle Mead, N.J.

[73] Assignee: STMicroelectronics, Inc., Carrollton, Tex.

[21] Appl. No.: 08/962,343

[22] Filed: Oct. 31, 1997

[51] Int. Cl.[6] .......................... H01L 29/76; H01L 29/94; H01L 31/062
[52] U.S. Cl. .......................... 257/328; 257/327; 257/329
[58] Field of Search .................................. 257/328, 327, 257/329

[56] References Cited

U.S. PATENT DOCUMENTS 4,455,565  6/1984  Goodman et al. ...................... 357/23.4

FOREIGN PATENT DOCUMENTS

0119400 A1  9/1984  European Pat. Off. ........ H01L 29/78

Primary Examiner—Valencia Martin-Wallace
Assistant Examiner—Jesse A. Fenty
Attorney, Agent, or Firm—Theodore E. Galanthay; Lisa K. Jorgenson; Renee M. Larson

[57] ABSTRACT

A power MOSFET suitable for use in RF applications and a method for making the same is disclosed. The power MOSFET has an increased distance between gate and drain regions of the device in order to decrease the device gate to drain capacitance $C_{gd}$. The distance between the gate and drain regions is increased by selective doping of a polysilicon layer of the gate to produce at least two polysilicon gate regions separated by a region of undoped polysilicon that is positioned over a substantial portion of the drain region that resides between the channel portions of the body region of the device. The addition of a contact oxide layer formed directly above the region of undoped polysilicon further increases the distance between gate and drain. Finally, a metal layer is deposited over the entire structure to form the gate and source electrodes of the device.

14 Claims, 3 Drawing Sheets

RADIO FREQUENCY POWER MOSFET DEVICE HAVING IMPROVED PERFORMANCE CHARACTERISTICS

CROSS REFERENCE TO RELATED APPLICATION

The subject matter of the present application is related to copending U.S. application Ser. No. 08/962,342, filed herewith and having the same filing date, titled "METHOD FOR FABRICATING A RADIO FREQUENCY POWER MOSFET DEVICE HAVING IMPROVED PERFORMANCE CHARACTERISTICS", Docket No. 97-M-150, which is assigned to SGS-Thomson Microelectronics, Inc. and expressly incorporated herein by reference.

FIELD OF THE INVENTION

The present invention relates generally to a semiconductor device for a MOSFET (Metal-Oxide-Semiconductor Field Effect Transistor), and more particularly to a RF (radio frequency) power MOSFET device having improved performance characteristics.

BACKGROUND OF THE INVENTION

Power Metal Oxide Semiconductor Field Effect Transistors (MOSFETs) are commonly used in RF applications such as transmitters and receivers and other products such as plasma generators. For such applications, it is desirable that power MOSFET devices consistently strive to provide higher performance and higher frequency operation.

The performance of a power MOSFET device is closely related to its gate dimensions. A smaller gate has a shorter channel dimension than does a larger gate and the shorter channel dimension of a smaller gate contributes to high gain and efficiency of the device at high frequencies. Power output is directly proportional to the gate periphery. In addition to the channel dimensions of the gate, device performance of a power MOSFET at radio frequencies is also closely related to the capacitances of the device. First, the input capacitance of the MOSFET, referred to as $C_{iss}$, composed of gate capacitances $C_{gs}$ and $C_{gd}$, is critical to transistor performance. Input capacitance $C_{iss}$ is inversely proportional to the maximum frequency of the device, $F_{max}$ and hence $F_t$. Thus, reducing $C_{iss}$ has the effect of increasing the maximum frequency at which the MOSFET can operate as well as the device gain and efficiency. It is therefore desirable to decrease $C_{gs}$ and/or $C_{gd}$ in order to reduce $C_{iss}$. Conversely, it is undesirable to increase either $C_{gs}$ and $C_{gd}$ to the extent that $C_{iss}$ would be increased, for this would have the undesirable effect of producing a corresponding decrease in $F_t$. As is well known in the art, $C_{gs}$ is the gate to source capacitance of the device and $C_{gd}$ is the gate to drain capacitance of the device.

Second, the feedback capacitance of the MOSFET, referred to as $C_{rss}$, is the capacitance from the output to the input of the device and is therefore equal to gate to drain capacitance $C_{gd}$ only. The value of $C_{rss}$ is voltage dependent and is a critical dimension in the design of any power MOSFET application that uses negative feedback to obtain wide band performance.

Vertical, double diffused MOS (VDMOS) devices and in particular TMOS devices, are characterized as having two channel regions under the gate in order to increase the gate periphery to attain higher packaging density so that a higher power per unit area of the device may be achieved. The term "vertical" is descriptive of the fact that currents flow in the vertical direction of the transistor cell. The two channels are separated by an area of a drain under the gate that determines the value of $C_{gd}$. $C_{gd}$ will obviously be decreased by decreasing the portion of the drain under the gate, but this will also serve to increase the drain resistance of the device, thereby degrading device performance, more specifically power and gain. Otherwise altering the drain region under the gate may have other, undesirable effects. For instance, increasing the doping of the drain region under the gate will lower the breakdown voltage of the device.

A typical structure of a prior art vertical MOSFET that utilizes polysilicon as part of the gate region is shown in FIG. 1. FIG. 1 is the prior art FIG. 1 of European patent application 84100812.5, bearing publication number 0119400, was published on Sep. 25, 1984, hereby incorporated by reference. An N--type layer of low impurity concentration is epitaxially grown on low resistivity drain substrate 1 having an N+-type silicon wafer of high impurity concentration to form drain region 2 of high resistivity. Semiconductor wafer 4 is composed of drain substrate 1 together with drain region 2. Next, insulating coating 3 for a gate is formed on a top surface of drain region 2 by thermal oxidation, followed by a polysilicon film that forms gate electrode 5. Portions of the polysilicon film are selectively removed using photo-etching to open source windows. Using a double diffusion method, through the source windows thus formed, well region 6 that operates as a channel is formed. Advantages of applying the double diffusion method to a large number of transistor elements, known in the art, include uniformity in the characteristics of each transistor, improved production yield, and small transistor size. Next, source and well contact regions 7, 8 which diffuse concentrically within well region 6 from the center outward are formed as shown. After completion of the double diffusion process, source electrode 10 is formed along the upper surface of the polysilicon gate electrode 5 through insulating film 9 by vacuum deposition. Finally, drain electrode 11 is formed on the bottom surface of drain substrate 1 as shown.

A problem with the prior art vertical MOSFET of FIG. 1 has to do with the formation of the gate electrode 5 with respect to the drain region 2 and the large gate to drain capacitance $C_{gd}$ that results. Referring again to FIG. 1, it can be seen that these regions are separated only by the thin layer of insulating coating 3, resulting in a large capacitance between the gate and drain regions. The European patent application 84100812.5 is most concerned with high switching speeds and the feedback function that the large $C_{gd}$ will serve from the output of a switching element to its input. The presence of this feedback function introduced by $C_{gd}$ makes it difficult to perform switching at high speeds. Therefore, European patent application 84100812.5, while not concerned with RF power MOSFET device applications, is nonetheless concerned with lowering $C_{gd}$.

European patent application 84100812.5 addresses the large $C_{gd}$ problem by interposing a raised portion of oxide film between the drain region 2 and the polysilicon gate electrode 5. An enlarged portion of oxide film interposed between the drain and gate regions projects up from the drain region towards the gate and has the effect of increasing the distance between gate and drain and therefore decreasing $C_{gd}$. The three embodiments in which an enlarged portion of oxide film is interposed between the drain and gate regions are illustrated in FIGS. 2(I), 3(G), and 4(H), respectively, of the 84100812.5 application.

While the enlarged portion of oxide film does operate to reduce $C_{gd}$, the process required to form the enlarged portion of oxide film requires additional steps directed just to its formation, rendering the process more lengthy. In the first embodiment, shown in FIG. 2(I), it is necessary to form recess portions into which the enlarged portions of oxide film 23 are formed. The enlarged portions of oxide film are in addition to the film of silicon oxide film that is normally disposed between the gate and drain regions. In the second embodiment, shown in FIG. 3(G), thick oxide regions 125 are formed, a silicon nitride film and underlying thin oxide film removed, and then the silicon oxide insulating layer that normally exists between the gate and drain is formed. As in FIG. 2(I), thick oxide regions 125 have the effect of pushing up the peripheral portion of film 123 in order to maximize the distance between the gate and drain. Finally, in the third embodiment, shown in FIG. 4(H), the enlarged oxide bump 226 is formed by actually oxidizing a portion of polysilicon gate electrode 223.

In addition to requiring a complicated manufacturing process to form the enlarged oxide bumps, European patent application 84100812.5 has a most undesirable side effect. As shown in FIGS. 2(I), 3(G), and 4(H), the last step of forming the MOSFET device is to form the source electrode over the polysilicon portions of the gate; the gate electrode itself is not shown. The formation of the source electrode over the entire gate region, however, operates to dramatically increase the gate to source capacitance, $C_{gs}$, of the device.

Such a substantial increase in $C_{gs}$ of the device may not be of concern in the high speed switching technology to which the European patent application 84100812.5, but it cannot be tolerated in RF applications that use power MOSFET devices to which the present invention is directed. As discussed above, the input capacitance of the MOSFET, $C_{iss}$, is inversely proportional to $F_t$ and is therefore a critical parameter of power MOSFET performance. Since $C_{iss}$ is composed of both gate capacitances $C_{gs}$ and $C_{gd}$, an increase in either $C_{gs}$ or $C_{gd}$ that operates to increase $C_{iss}$ will have an adverse effect on power MOSFET device performance. Since the source electrode of the European patent application 84100812.5 operates to substantially increase $C_{gs}$, this is not an acceptable solution for use with power MOSFET devices.

Referring to FIG. 2, another structure of a typical prior art vertical MOSFET is shown. One of the most important distinctions between FIG. 1 and FIG. 2 is that the structure of FIG. 2 does not utilize polysilicon as part of the gate region; rather gate 34 is formed by gate oxide 36 and metal gate electrode 38. FIG. 2 is the prior art FIG. 1 of U.S. Pat. No. 4,455,565, issued on Jun. 19, 1984 to Goodman et al., hereby incorporated by reference. In the figure, the following parts of the MOSFET structure are shown: substrate 12, 14—first surface of substrate 12,16—second surface of substrate 12, source region 18, body region 20, drain region 22, body/drain P/N junction 23, 24—high conductivity portion of drain region 22, 26—extended drain/region of lower conductivity portion of 22, channel portions 28, drain electrode 30, source electrode 32, and gate region 34 composed of gate oxide 36 and gate electrode 38.

As described in U.S. Pat. No. 4,455,565 at column 2, lines 9 to 37, adjacent source, body and drain regions 18, 20, and 22, respectively, are of alternate conductivity type. For instance, source region 18 is N+, body region 20 is P, and drain region 22 is N+. Drain electrode 30 along the bottom surface 16 of substrate 12 in contact with 24, the relatively high conductivity portion of the drain region 22. Source electrode 32 is in contact with source regions 18 and body regions 20 in areas displaced from channel portions 28. As shown in the figure, gate 34 is disposed on surface 14 over both pair of channel portions 28 and extended drain region 26 between channel portions 28. Gate 34 includes gate oxide 36 over the first surface 14 of substrate 12 and gate electrode 38 formed on gate oxide 36 as shown.

U.S. Pat. No. 4,455,565, like European patent application 84100812.5, is concerned with the gate to drain capacitance $C_{gd}$ but reduces $C_{gd}$ using a different vertical MOSFET method and structure. In the invention of U.S. Pat. No. 4,455,565, illustrated in FIG. 2 of the patent, the portion of gate electrode 38 that overlays the extended drain region 26 disposed between the two channel portions 28 is removed and replaced with an insulated shield electrode. The portions of gate electrode 38 that overlay the channel portions 28 and source regions 28 are maintained. The effect is two gate electrodes separated by an insulated shield electrode that overlays the drain region of the device. This operates to minimize the feedback capacitance by applying a substantially high positive bias and therefore has the desirable effect of decreasing gate to drain capacitance $C_{gd}$.

While this configuration does operate to lower gate to drain capacitance, it is not accomplished without considerable cost. The insulated shield electrode must be maintained at a constant positive bias. Additional circuitry is required to maintain the insulated shield electrode at the constant bias voltage by applying a voltage, usually much larger than the voltage applied to the gate electrodes, to the insulated shield electrode. Column 3, lines 35–39, of the patent disclose that while the gate electrode may be provided with 0 to 30 volts, the insulated gate electrode would be provided with 30 to 60 volts in order to maintain the required constant bias voltage. Thus, even though U.S. Pat. No. 4,455,565 does operate to reduce $C_{gd}$, the additional circuitry required to maintain the insulated shield electrode that makes it possible to achieve the reduced $C_{gd}$ is a definite drawback.

There is therefore an unmet need in the art to be able to reduce the gate to drain capacitance of a MOS transistor device without otherwise adversely affecting the performance of the device or requiring additional circuitry or processing steps that significantly increase manufacturing costs of the device.

SUMMARY AND OBJECTS OF THE INVENTION

It is therefore an object of the present invention to provide a vertical power MOSFET device, suitable for use in RF applications, that substantially reduces the capacitance between the gate and the drain of the device in order to substantially improve the performance of the power MOSFET device, specifically power and gain, at radio frequencies.

It is another object of the present invention to provide a vertical power MOSFET device, suitable for use in RF applications, that substantially reduces the capacity between the gate and the drain of the device without incurring a large increase in the gate to source capacitance of the device.

It is yet another object of the present invention to provide a vertical power MOSFET device having a reduced gate to drain capacitance that is formed using the double diffusion method of the prior art.

It is still another object of the present invention to provide a vertical power MOSFET device that substantially reduces the capacity between the gate and the drain of the device in a manner that is not unduly complicated by additional required steps and procedures.

Therefore, according to a preferred embodiment of the present invention, a power MOSFET suitable for use in RF applications has an increased distance between gate and drain regions of the device in order to decrease the device gate to drain capacitance $C_{gd}$. The distance between the gate and drain regions is increased by selective doping of a polysilicon layer of the gate to produce at least two polysilicon gate regions separated by a region of undoped polysilicon that is positioned over a substantial portion of the drain region that resides between the channel portions of the body region of the device. The addition of a contact oxide layer formed directly above the region of undoped polysilicon further increases the distance between gate and drain. Finally, a metal electrode is deposited over the entire structure to form the gate and source electrodes of the device.

These and other objects of the invention will become apparent from the detailed description of the invention in which numerals used throughout the description correspond to those found in the drawing figures.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

A method for producing a unique power MOSFET suitable for use in RF applications is disclosed. The power MOSFET increases the distance between gate and drain regions of the device in order to decrease the device gate to drain capacitance $C_{gd}$. The distance between the gate and drain regions is increased by selective doping of a polysilicon layer of the gate to produce at least two polysilicon gate regions separated by a region of undoped polysilicon that is positioned over a substantial portion of the drain region that resides between the channel portions of the body region of the device. The addition of a contact oxide layer formed directly above the region of undoped polysilicon further increases the distance between gate and drain. Finally, a metal electrode is deposited over the entire structure to form the gate electrode of the device.

Figure 1:
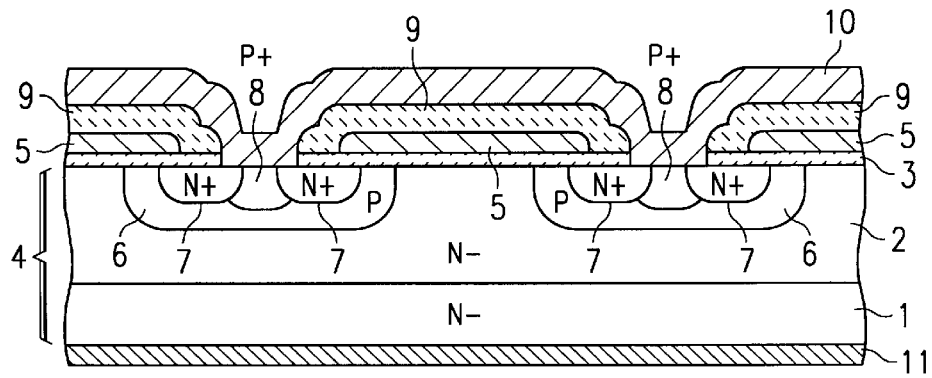
FIG. 1 is a typical structure of a prior art vertical MOSFET that utilizes polysilicon as part of the gate region, according to the prior art.
Figure 2:
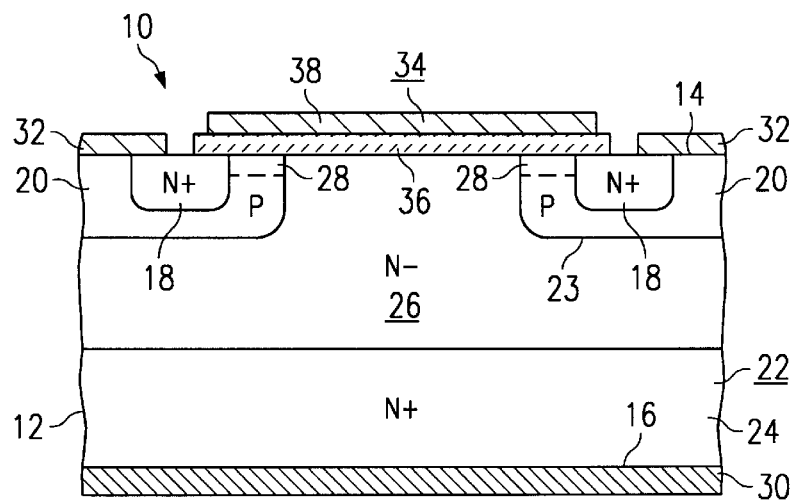
FIG. 2 is a structure of a typical prior art vertical MOSFET that does not utilize polysilicon as part of the gate region, according to the prior art.
Figure 3:
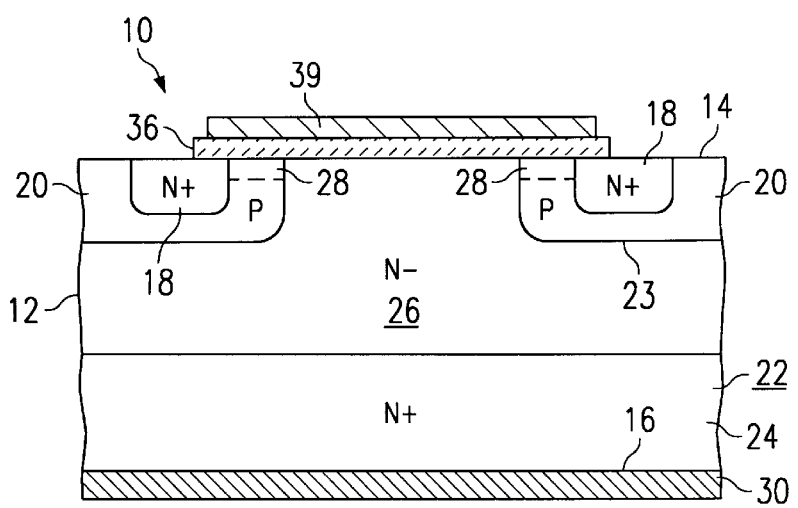
FIGS. 3 to 7 illustrate the processing steps required to produce the power MOSFET device of the present invention.

FIGS. 3 to 7 illustrate the processing steps required to produce the power MOSFET device of the present invention. Referring to FIG. 3, a MOSFET device 10 having a polysilicon layer 39 is shown. It should be noted that FIG. 3 is similar to prior art FIG. 2 of U.S. Pat. No. 4,455,565 with the exception that a polysilicon layer 39, rather than a metal gate electrode, overlays the extended drain region 26 disposed between the two channel portions 28 and that source electrode 32 has not yet been formed.

In the manner known in the art, over substrate 12, an epitaxial region is formed. Gate oxide 36 is grown on the upper surface 14 of substrate 12. Polysilicon is deposited over gate oxide 36 and the polysilicon is cut to define polysilicon layer 39. Areas of the device not protected by polysilicon layer 39 are doped to form body regions 20 and the device is then heated causing the body regions 20 to extend under the polysilicon layer 39. The extended drain portion 26 is bounded by the body regions 20. The source regions 18 are next formed, in the process forming channel portions 28.

Figure 4:
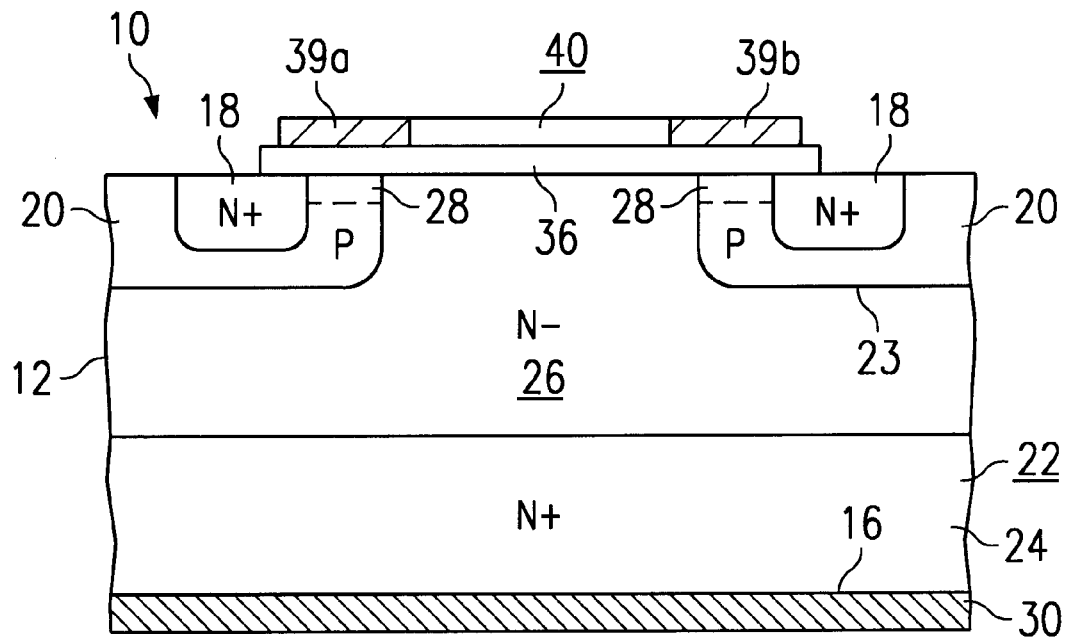

Next, as illustrated in FIG. 4, selective doping of polysilicon layer 39 is performed to produce two polysilicon gate electrodes 39a and 39b and an undoped polysilicon region 40. Polysilicon gate electrodes 39a and 39b could be doped by either P or N type material; in this case, polysilicon gate electrodes 39 are doped with N material. A variety of implant dosages might be used; as an example, a typical implant dosage would be approximately $5 \times 10^{15}$ atoms/cc. Obviously, prior to the implantation step, a photoresist or other protection device must be placed over the portion of polysilicon layer 39 that is to remain undoped to form undoped polysilicon region 40.

The placement of polysilicon gate electrodes 39a, 39b and undoped polysilicon region 40 with respect to the drain and source regions of the power MOSFET device is important. Each polysilicon gate electrode 39a, 39b is formed to overlay at least a portion of N+ source region 18 and at least a small portion of the N− extended drain region 26 adjacent to channel portion 28 so as to completely overlay channel portion 28. The gate electrode 39a, 39b must completely overlap the channel portion 28 under it and at least a small portion of extended drain region 26 or the gate to be formed cannot function to open channel portion 28. The placement of undoped polysilicon region 40 completely separates polysilicon gate electrodes 39a, 39b with no intervening gaps. As shown in the figure, undoped polysilicon region 40 covers substantially all of extended drain region 26 that is positioned between channel portions 28 with the exception of the slight overhang of polysilicon gate electrodes 39a, 39b over a small portion of extended drain region adjacent to channel portions 28. The introduction of undoped polysilicon region 40, a dielectric region, over substantially all of extended drain region 26 positioned between channel portions 28 increases the distance between extended drain region 26 and polysilicon gate electrodes 39a, 39b, thereby decreasing $C_{gd}$. It is an obvious advantage to decrease the overhang of polysilicon gate electrodes 39a, 39b over extended drain region 26 in order to maximize the coverage of undoped polysilicon region 40 over extended drain region 26. However, polysilicon gate electrodes 39a, 39b must always cover at least some minimal portion of extended drain region 26 adjacent to channel portions 28 for the MOSFET device to operate properly.

Figure 5:
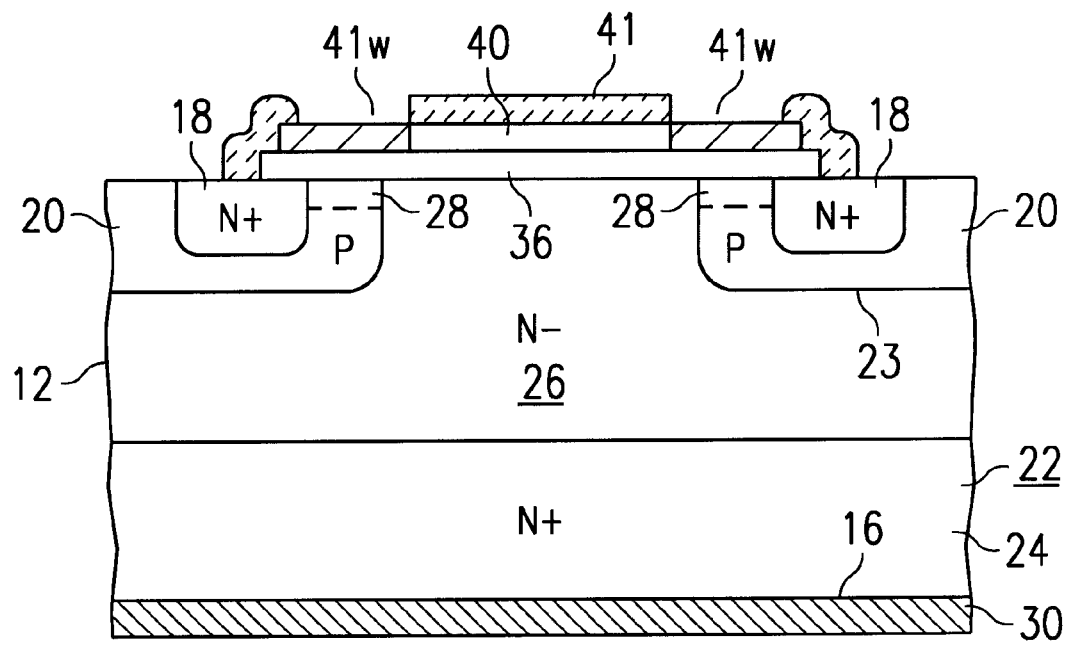
Figure 6:
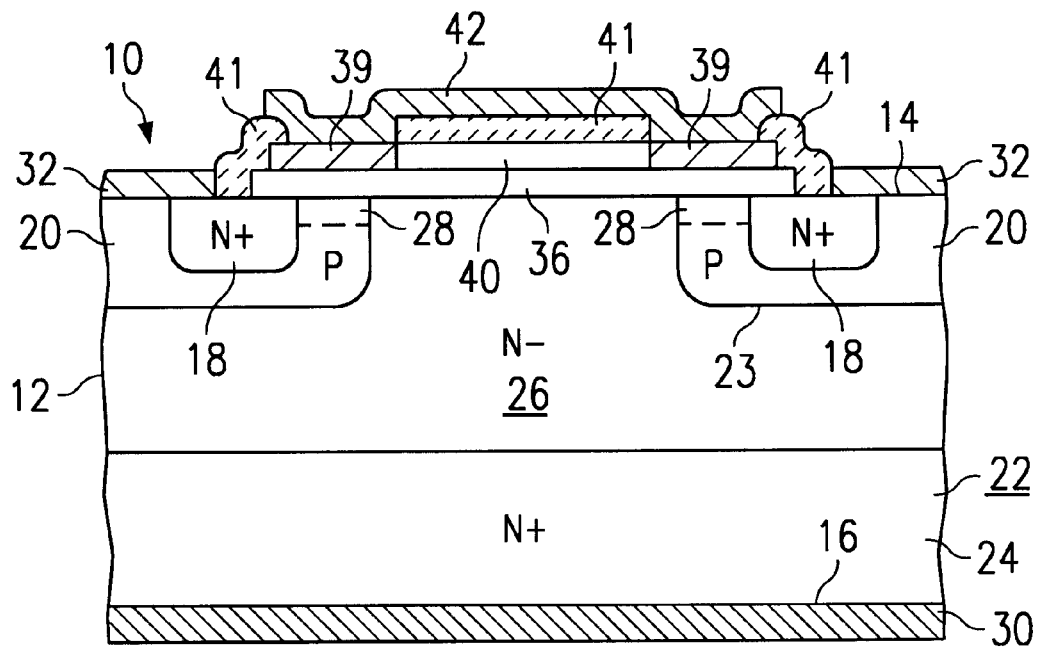

Referring to FIG. 5, a layer of contact oxide 41 is formed over polysilicon gate electrodes 39a, 39b, undoped polysilicon region 40, and exposed portions of gate oxide 36. Windows 41w are formed in contact oxide layer 41 to expose a portion of the upper surface of polysilicon gate electrodes 39a, 39b that will make electrical contact with a metal layer to be deposited. After windows 41w are formed, undoped polysilicon region 40 is still completely covered by contact oxide 41. In FIG. 6, a metal layer, typically made of gold or aluminum, is formed in the windows 41w so as to make electrical contact with the exposed portions of polysilicon gate electrodes 39a, 39b and over the portion of contact oxide layer 41 that is formed over the undoped polysilicon region 40. Metal gate electrode 42 is the metal layer so formed. It should be further noted that source electrodes 32 are formed at the same time metal gate electrode 42 is formed, as shown in the figure. It is standard practice to place metal silicide between the silicon and metal to obtain an ohmic contact and this is not shown here.

Figure 7:
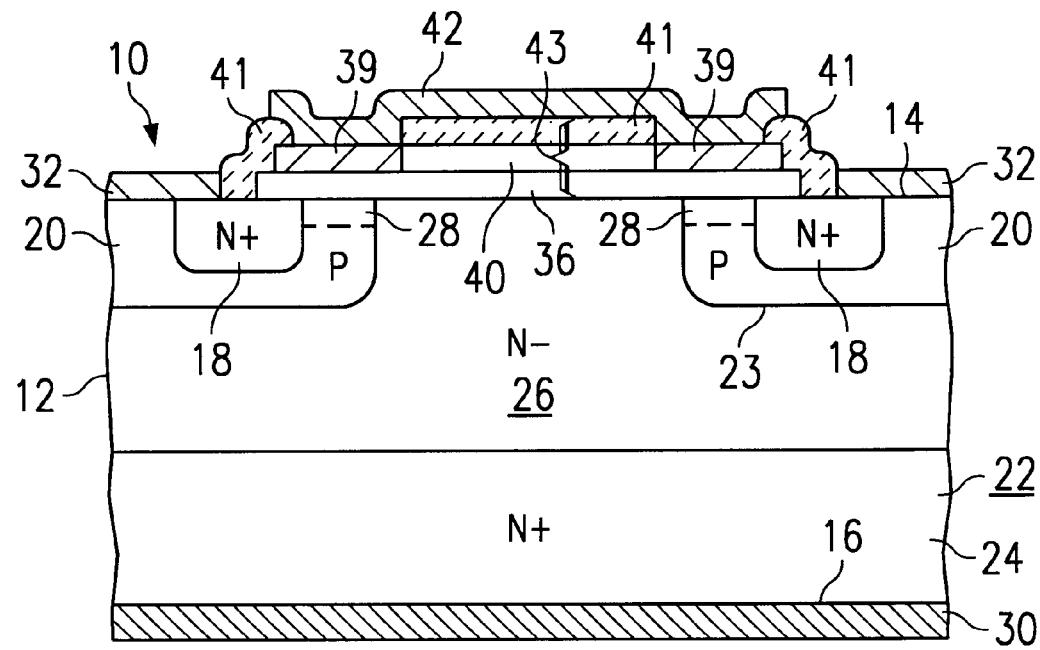

FIG. 7 illustrates the power MOSFET device of the present invention. The gate is composed of the gate oxide 36, the polysilicon gate electrodes 39a, 39b, and metal gate electrode 42. The present invention has substantially increased the distance between the gate and the drain of the device through the addition of undoped polysilicon region 40 and contact oxide layer 41. The separation of metal gate electrode 42 over extended drain region 26 is denoted by 43, which may be thought of as a sandwich of layers having a width equal to the width of gate oxide 36, the width of undoped polysilicon region 40 and the width of oxide layer 41. Of course, the wider any of these layers are, the more physical separation there is between gate and drain and the lower the $C_{gd}$ of the device. And, unlike the European patent application 84100812.5, lower $C_{gd}$ is achieved without an increase in $C_{gs}$.

While the invention has been particularly shown and described with reference to a preferred embodiment, it will be understood by those skilled in the art that various changes in form and detail may be made therein without departing from the spirit and scope of the invention. One skilled in the art will recognize that various manufacturing steps recognized in the art may be used to produce the structure illustrated in FIG. 3.

What is claimed is:

1. A vertical MOSFET device, comprising:
   a semiconductor substrate having first and second opposing major surfaces;
   a drain region of first conductivity type disposed across the second surface and including an extended drain portion extending to the first surface;
   a body region of second conductivity type extending into the substrate from the first surface and being bounded by the extended drain portion;
   a source region of first conductivity type extending into the substrate from the first surface within the boundaries of the body region;
   a channel portion, defined at the first surface by the source region and the extended drain portion;
   a source electrode contacting the source and body regions on the first surface;
   a drain electrode contacting the drain region on the second surface;
   a polysilicon gate electrode disposed on the first surface over the channel portion and at least a portion of the extended drain portion adjacent the channel portion;
   an undoped polysilicon region disposed on the first surface adjacent to the polysilicon gate electrode only over a substantial portion of the extended drain portion; and
   a metal gate electrode disposed over the polysilicon gate electrode and the undoped polysilicon region in a manner to make electrical contact with the polysilicon gate electrode.

2. The device of claim 1, further comprising:
   an oxide layer underlying the metal gate electrode directly over the undoped polysilicon region only.

3. The device of claim 1, further comprising:
   an oxide layer underlying the polysilicon gate electrode and the undoped polysilicon region on the first surface.

4. The device of claim 3, further comprising:
   a source electrode disposed on the first surface adjacent to the oxide layer.

5. A vertical MOSFET device, comprising:
   a semiconductor substrate having first and second opposing major surfaces;
   a drain region of first conductivity type disposed across the second surface and including an extended drain portion extending to the first surface;
   a body region of second conductivity type extending into the substrate from the first surface and being bounded by the extended drain portion;
   a source region of first conductivity type extending into the substrate from the first surface within the boundaries of the body region;
   a channel portion, defined at the first surface by the source region and the extended drain portion;
   a source electrode contacting the source and body regions on the first surface;
   a drain electrode contacting the drain region on the second surface;
   a polysilicon gate electrode disposed on the first surface over the channel portion and at least a portion of the extended drain portion adjacent the channel portion;
   an undoped polysilicon region disposed on the first surface adjacent to the polysilicon gate electrode only over a substantial portion of the extended drain portion;
   a first oxide layer disposed over the undoped polysilicon region only; and
   a metal gate electrode disposed over the polysilicon gate electrode and the first oxide layer in a manner to make electrical contact with the polysilicon gate electrode.

6. The device of claim 5, further comprising:
   a second oxide layer underlying the polysilicon gate electrode and the undoped polysilicon region on the first surface.

7. The device of claim 6, further comprising:
   a source electrode disposed on the first surface adjacent to the second oxide layer.

8. A vertical MOSFET device, comprising:
   a semiconductor substrate having first and second opposing major surfaces;
   a drain region of first conductivity type disposed across the second surface and including an extended drain portion extending to the first surface;
   a pair of body regions of second conductivity type extending into the substrate from the first surface, the body regions being spaced apart by the extended drain portion;
   a pair of source regions of first conductivity type, each extending into the substrate from the first surface within the boundaries of a body region of the pair of body regions;
   a pair of channel portions, defined at the first surface by the pair of source regions and the extended drain portion therebetween;
   a source electrode contacting the source and body regions on the first surface;
   a drain electrode contacting the drain region on the second surface;
   a pair of polysilicon gate electrodes disposed on the first surface over the pair of channel portions and at least a portion of the extended drain portion adjacent the pair of channel portions;
   an undoped polysilicon region disposed on the first surface only over a substantial portion of the extended drain portion and separating the pair of polysilicon gate electrodes; and a metal gate electrode disposed over the pair of polysilicon gate electrodes and the undoped polysilicon region in a manner to make electrical contact with the pair of polysilicon gate electrodes.

9. The device of claim 8, further comprising:

an oxide layer underlying the metal gate electrode directly over the undoped polysilicon region only.

10. The device of claim 8, further comprising:

an oxide layer underlying the pair of polysilicon gate electrodes and the undoped polysilicon region on the first surface.

11. The device of claim 10, further comprising:

a pair of source electrodes disposed on the first surface adjacent to the oxide layer.

12. A vertical MOSFET device, comprising:

a semiconductor substrate having first and second opposing major surfaces;

a drain region of first conductivity type disposed across the second surface and including an extended drain portion extending to the first surface;

a pair of body regions of second conductivity type extending into the substrate from the first surface, the body regions being spaced apart by the extended drain portion;

a pair of source regions of first conductivity type, each extending into the substrate from the first surface within the boundaries of a body region of the pair of body regions;

a pair of channel portions, defined at the first surface by the pair of source regions and the extended drain portion therebetween;

a source electrode contacting the source and body regions on the first surface;

a drain electrode contacting the drain region on the second surface;

a pair of polysilicon gate electrodes disposed on the first surface over the pair of channel portions and at least a portion of the extended drain portion adjacent the pair of channel portions;

an undoped polysilicon region disposed on the first surface only over a substantial portion of the extended drain portion and separating the pair of polysilicon gate electrodes;

a first oxide layer disposed over the undoped polysilicon region only; and a metal gate electrode disposed over the pair of polysilicon gate electrodes and the first oxide layer in a manner to make electrical contact with the pair of polysilicon gate electrodes.

13. The device of claim 12, further comprising:

a second oxide layer underlying the pair of polysilicon gate electrodes and the undoped polysilicon region on the first surface.

14. The device of claim 13, further comprising:

a pair of source electrodes disposed on the first surface adjacent to the second oxide layer.

* * * * *